US011088153B2

(12) United States Patent
Bell

(10) Patent No.: US 11,088,153 B2
(45) Date of Patent: *Aug. 10, 2021

(54) INTEGRATED ARRANGEMENTS OF PULL-UP TRANSISTORS AND PULL-DOWN TRANSISTORS, AND INTEGRATED STATIC MEMORY

(71) Applicant: Micron Technology, Inc., Boise, ID (US)

(72) Inventor: Debra M. Bell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/927,717

(22) Filed: Jul. 13, 2020

(65) Prior Publication Data

US 2020/0343249 A1    Oct. 29, 2020

Related U.S. Application Data

(63) Continuation of application No. 16/427,176, filed on May 30, 2019, now Pat. No. 10,741,566.

(60) Provisional application No. 62/689,951, filed on Jun. 26, 2018.

(51) Int. Cl.
| | | |
|---|---|---|
| H01L 27/11 | (2006.01) | |
| G11C 11/419 | (2006.01) | |
| G11C 11/412 | (2006.01) | |
| H01L 27/092 | (2006.01) | |

(52) U.S. Cl.
CPC ........ *H01L 27/1104* (2013.01); *G11C 11/412* (2013.01); *G11C 11/419* (2013.01); *H01L 27/092* (2013.01)

(58) Field of Classification Search
None
See application file for complete search history.

(56) References Cited

U.S. PATENT DOCUMENTS

| | | | |
|---|---|---|---|
| 7,452,768 B2 | 11/2008 | Min et al. | |
| 9,711,511 B1 | 7/2017 | Lim et al. | |
| 10,115,438 B2* | 10/2018 | Ingalls | G11C 7/062 |
| 10,177,159 B2 | 1/2019 | Bell et al. | |
| 10,211,206 B1* | 2/2019 | Zang | H01L 27/092 |

(Continued)

OTHER PUBLICATIONS

Nho et al., "A High-Speed, Low-Power 3D-SRAM Architecture", IEEE Custom Integrated Circuits Conference, Sep. 2008, United States, pp. 201-204.

*Primary Examiner* — Tan T. Nguyen
(74) *Attorney, Agent, or Firm* — Wells St. John P.S.

(57) ABSTRACT

Some embodiments include an integrated assembly having a first pull-down transistor, a second pull-down transistor, a first pull-up transistor and a second pull-up transistor. The first pull-down transistor has a first conductive-gate-body at a first level, and has an n-channel-device-active-region at a second level vertically offset from the first level. The first pull-up transistor has a second conductive-gate-body at the first level, and has a p-channel-device-active-region at the second level. The second pull-down transistor has a third conductive-gate-body at the second level, and has an n-channel-device-active-region at the first level. The second pull-up transistor has a fourth conductive-gate-body at the second level, and has a p-channel-device-active-region at the first level.

16 Claims, 4 Drawing Sheets

(56) References Cited

U.S. PATENT DOCUMENTS

| | | |
|---|---|---|
| 10,468,421 B2 | 11/2019 | Bell et al. |
| 10,741,566 B2* | 8/2020 | Bell .................... H01L 27/1104 |
| 2018/0069087 A1* | 3/2018 | Georgescu .......... H01L 29/7802 |
| 2019/0267387 A1 | 8/2019 | Lim et al. |
| 2019/0287957 A1 | 9/2019 | Anderson et al. |

* cited by examiner

INTEGRATED ARRANGEMENTS OF PULL-UP TRANSISTORS AND PULL-DOWN TRANSISTORS, AND INTEGRATED STATIC MEMORY

RELATED PATENT DATA

This patent resulted from a continuation of U.S. patent application Ser. No. 16/427,176 filed May 30, 2019, which claims priority to U.S. Provisional Application Ser. No. 62/689,951, which was filed Jun. 26, 2018, each of which is hereby incorporated herein by reference.

TECHNICAL FIELD

Integrated arrangements of pull-up transistors and pull-down transistors, and integrated static memory.

BACKGROUND

Memory has many uses in modern integrated circuitry. One known type of memory cell is a static memory cell, such as may be utilized in static random-access memory (SRAM). A static memory cell is characterized by operation in one of two mutually-exclusive and self-maintaining operating states. Each operating state defines one of the two possible binary bit values, zero or one. A static memory cell typically has an output which reflects the operating state of the memory cell. Such an output produces a "high" voltage to indicate a "set" operating state. The memory cell output produces a "low" voltage to indicate a "reset" operating state. A low or reset output voltage usually represents a binary value of zero, while a high or set output voltage represents a binary value of one.

A static memory cell is said to be bistable because it has two stable or self-maintaining operating states, corresponding to two different output voltages. Without external stimuli, a static memory cell will operate continuously in a single one of its two operating states. It has internal feedback to maintain a stable output voltage, corresponding to the operating state of the memory cell, as long as the memory cell receives power.

The operation of a static memory cell is in contrast to other types of memory cells, such as dynamic memory cells, which do not have stable operating states. A dynamic memory cell can be programmed to store a voltage which represents one of two binary values, but requires periodic reprogramming or "refreshing" to maintain this voltage for more than very short time periods.

A dynamic memory cell has no internal feedback to maintain a stable output voltage. Without refreshing, the output of a dynamic memory cell will drift toward intermediate or indeterminate voltages, resulting in loss of data. Dynamic memory cells are used in spite of this limitation because of the significantly greater packing densities which can be attained. For instance, a dynamic memory cell can be fabricated with a single MOSFET transistor, while static memory cells comprise more than one transistor. Because of the significantly different architectural arrangements and functional requirements of static and dynamic memory cells and circuits, static memory design has developed along generally different paths than has the design of dynamic memories.

In semiconductor processing, there is a continuing desire to make circuits denser, and to place components closer together to reduce the size of circuits. It would be desirable to develop improved architectures for static memory which are suitable for utilization in highly integrated applications.

BRIEF DESCRIPTION OF THE DRAWINGS

FIG. 2 is an expanded three-dimensional view of the cell, and shows top and bottom regions of the cell without showing an insulative sheet along the middle of the cell. FIGS. 2A and 2B are cross-sectional side views along the lines A-A and B-B, respectively, of FIG. 2.

DETAILED DESCRIPTION OF THE ILLUSTRATED EMBODIMENTS

Some embodiments include static memory having transistors (pull-up and pull-down transistors) configured as adjacent disks. The memory may be incorporated into highly integrated assemblies. Example embodiments are described with reference to FIGS. 1, 2, 2A and 2B.

Figure 1:
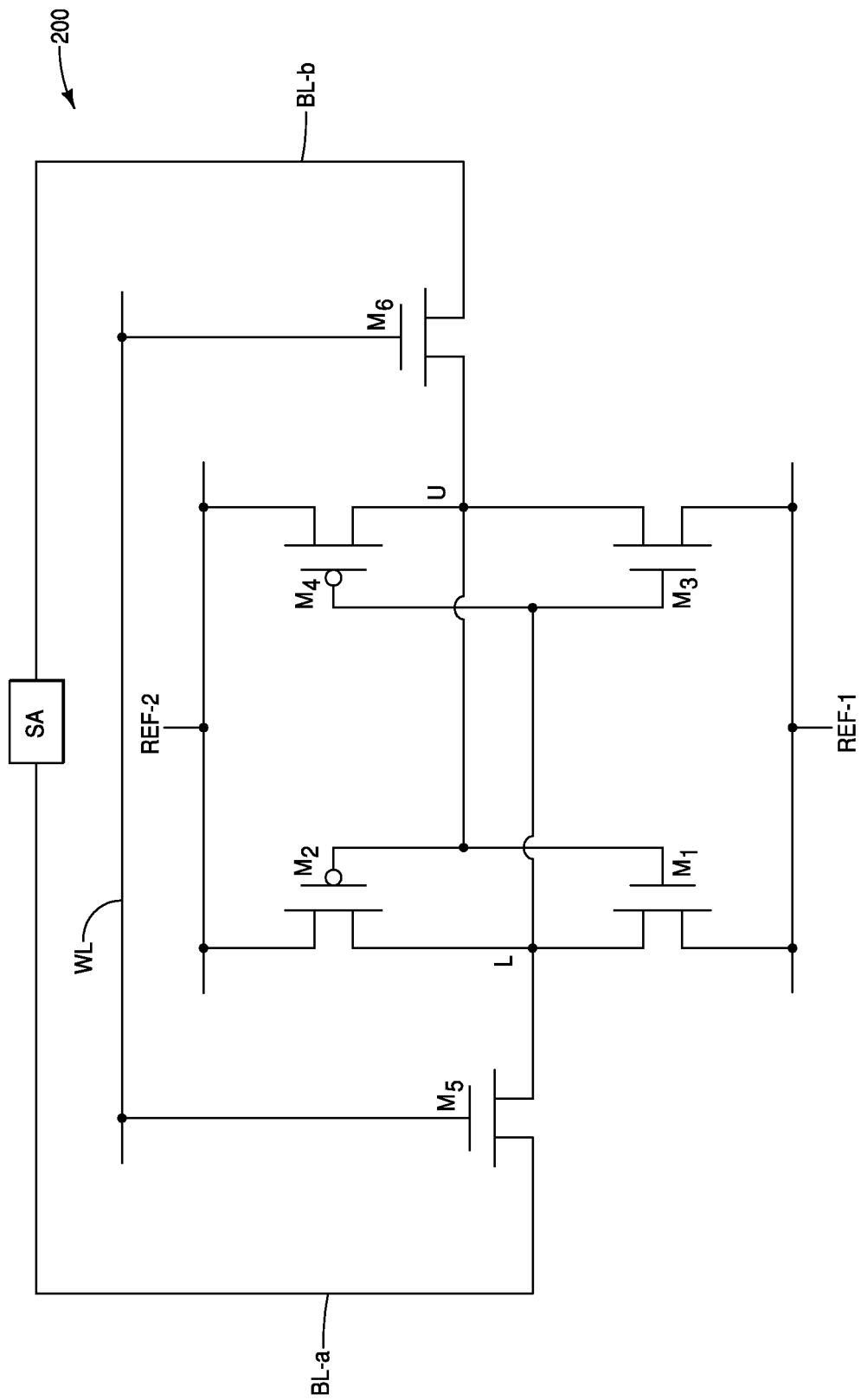
FIG. 1 is a circuit schematic of a static memory cell.

Referring to FIG. 1, such schematically illustrates an example static memory cell 200. The illustrated memory cell may be representative of a large number of substantially identical memory cells utilized in an integrated assembly (with the term "substantially identical" meaning identical to within reasonable tolerances of fabrication and measurement). In some applications, the memory cell 200 may be representative of cells utilized in SRAM.

The memory cell 200 comprises six transistors M1, M2, M3, M4, M5 and M6; with the transistors M2 and M4 being p-channel devices, and the remaining transistors being n-channel devices. The transistors M5 and M6 correspond to access transistors. The transistors M1 and M2 are a first driver transistor (i.e., pull-down transistor) and a first load transistor (i.e., pull-up transistor), respectively, of a first inverter; and the transistors M3 and M4 are a second driver transistor and a second load transistor, respectively, of a second inverter. The first and second inverters are cross-coupled with one another to form a bi-stable flip-flop. A wordline WL is electrically coupled with gates of the access transistors M5 and M6. First and second comparative bitlines BL-a and BL-b are coupled with terminals of the access transistors M5 and M6. The comparative bitlines extend to circuitry utilized for read/write operations associated with the memory cell 200 (such circuitry may comprise any suitable components, including, for example, logic, CMOS, a sense amplifier, drivers, etc.; and in the shown embodiment is shown comprising a sense amplifier, SA). The n-channel transistors M1, M3 have source/drain regions coupled with a first reference voltage REF-1 (such as, for example, VSS or ground), and the p-channel transistors M2, M4 have source/drain regions coupled with a second reference voltage REF-2 (such as, for example, VDD); with the second reference voltage being greater than the first reference voltage.

A first interconnect "L" couples a source/drain of access transistor M5 with source/drain regions of the transistors M1 and M2, and with gates of the transistors M3 and M4; and a second interconnect "U" couples a source/drain of access transistor M6 with source/drain regions of the transistors M3 and M4, and with gates of the transistors M1 and M2. The interconnects "L" and "U" may include any suitable conductive coupling arrangements; with example conductive coupling arrangements being described below with reference to an integrated assembly 10 shown in FIGS. 2-2B.

Figure 2:
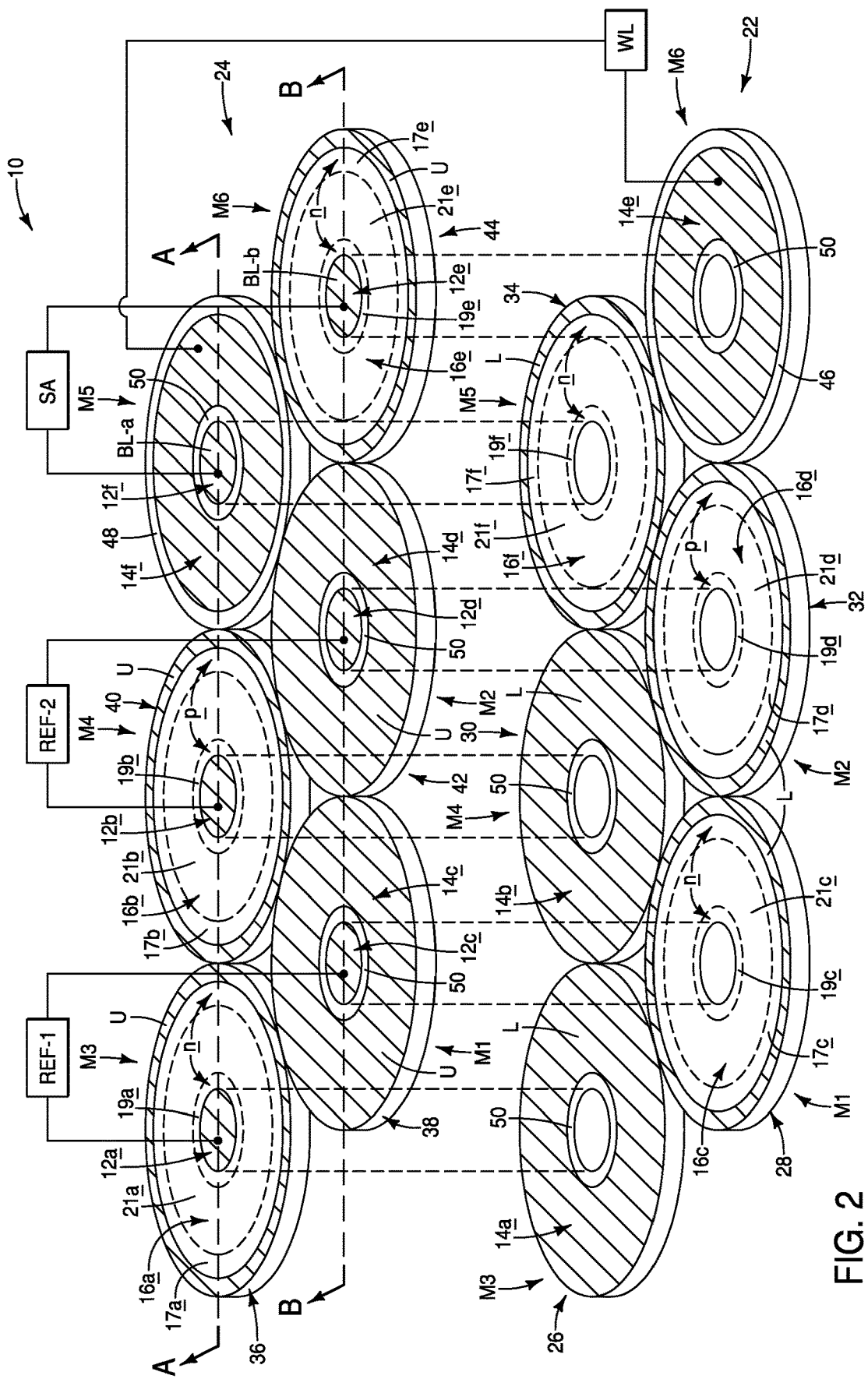
FIGS. 2-2B are diagrams of an example static memory cell.
Figure 2A:
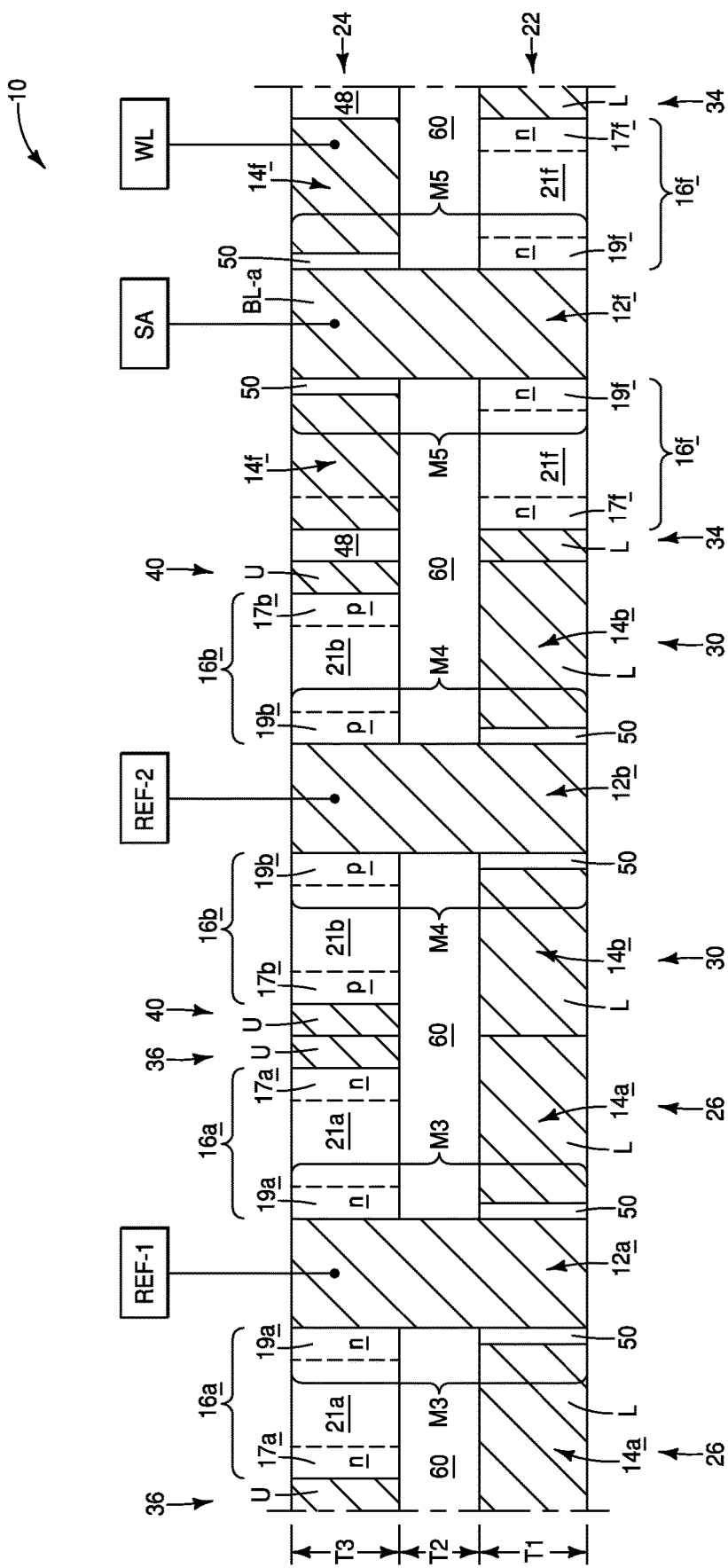
Figure 2B:
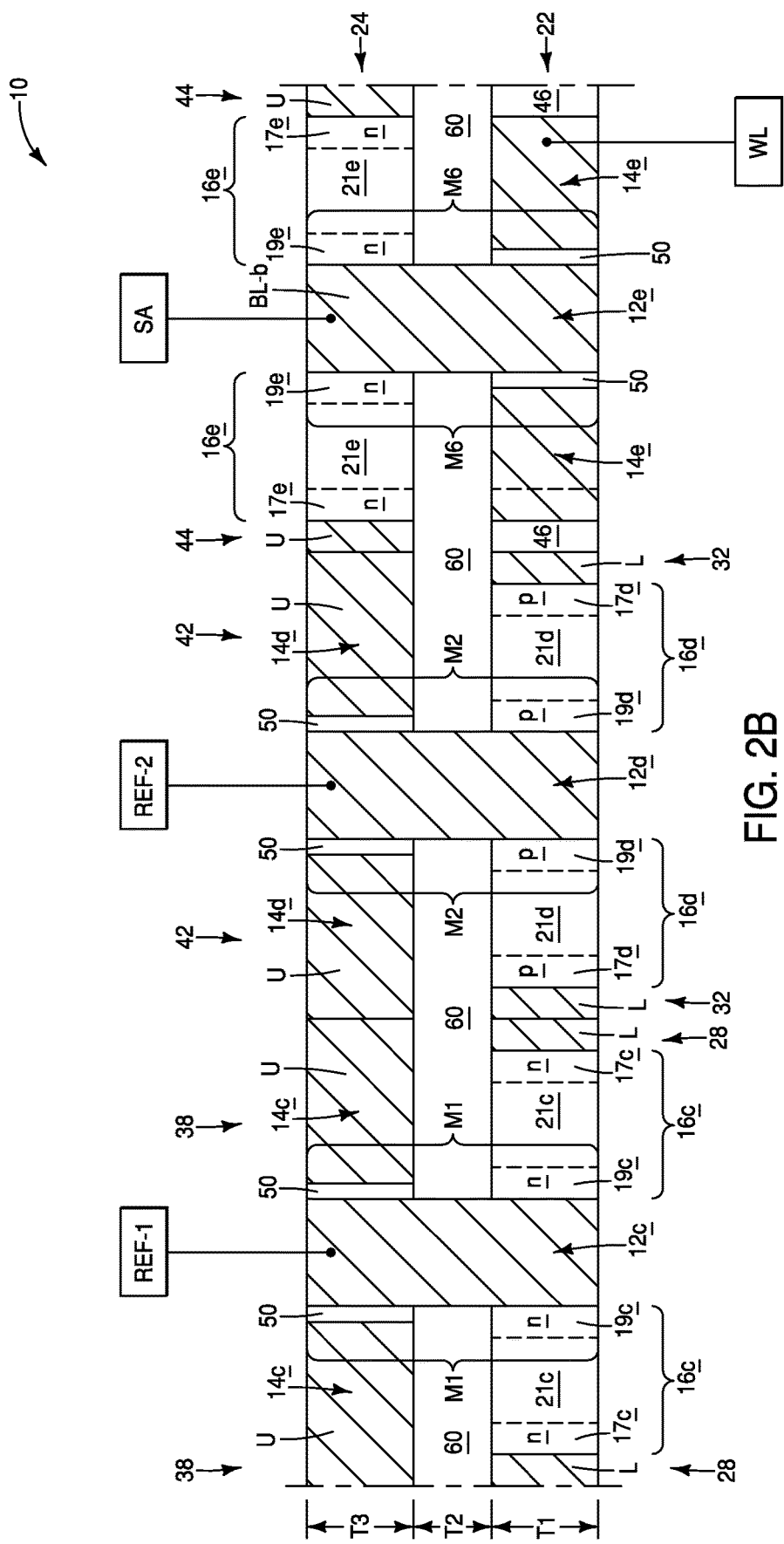

FIG. 2 is an expanded view of a region of the assembly 10, and shows portions of the various transistors and conductive interconnects. The view of FIG. 2 does not show gate dielectric material of the transistors in order to simplify the drawing. The views of FIGS. 2A and 2B are along the lines A-A and B-B, respectively, of FIG. 2, and show cross-sections through the assembly 10. The gate dielectric material is shown in the cross-sectional views of FIGS. 2A and 2B.

The assembly 10 includes the pull-up transistors M2 and M4, and the pull-down transistors M1, M3, M5 and M6. The pull-up transistors may be alternatively referred to as PMOS transistors, PMOS devices, p-channel transistors and p-channel devices; and the pull-down transistors may be alternatively referred to as NMOS transistors, NMOS devices, n-channel transistors and n-channel devices. P-channel devices will be considered to have p-channel-device-active-regions which include a channel region between a pair of p-type source/drain regions; and n-channel devices will be considered to have n-channel-device-active-regions which include a channel region between a pair of n-type source/drain regions. It is noted that PMOS transistors may have n-type doped channel (i.e., body) regions, but, in accordance with generally-accepted parlance, are referred to as p-channel devices due to the channels being operated to conduct holes between p-type source/drain regions. Similarly, NMOS transistors may have p-type doped channel (i.e., body) regions, but, in accordance with generally-accepted parlance, are referred to as n-channel devices due to the channels being operated to conduct electrons between n-type source/drain regions.

The assembly 10 includes six conductive pillars 12a, 12b, 12c, 12d, 12e and 12f, which may be referred to as first, second, third, fourth, fifth and sixth conductive pillars, respectively. The first and third conductive pillars 12a and 12c are coupled with the first reference voltage REF-1, and the second and fourth conductive pillars 12b and 12d are coupled with the second reference voltage REF-2. The fifth conductive pillar 12e is along the comparative bitline BL-b, and the sixth conductive pillar 12f is along the comparative bitline BL-a. The comparative bitlines BL-a and BL-b extend to the sense amplifier (SA).

The conductive pillars 12a-12f may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The conductive pillars 12a-f may all be the same composition as one another. Alternatively, at least one of the conductive pillars may comprise a different composition relative to at least one other of the conductive pillars.

The pull-down transistor M3 is along the first pillar 12a, and may be referred to as a first pull-down transistor. The pull-down transistor M3 has a conductive-gate-body 14a vertically offset from an n-channel-device-active-region 16a. The active region 16a includes a pair of n-type-doped source/drain regions 17a and 19a, which are spaced from one another by a channel region 21a. In the shown embodiment, the source/drain regions 17a and 19a are configured as annular rings which extend around an upper region of the pillar 12a. The conductive-gate-body 14a may be referred to as a first conductive-gate-body, and the n-channel-device-active-region 16a may be referred to as a first n-channel-device-active-region.

The pull-down transistor M1 is along the third pillar 12c, and may be referred to as a second pull-down transistor. The pull-down transistor M1 has a conductive-gate-body 14c vertically offset from an n-channel-device-active-region 16c. The active region 16c includes a pair of n-type-doped source/drain regions 17c and 19c, which are spaced from one another by a channel region 21c. In the shown embodiment, the source/drain regions 17c and 19c are configured as annular rings which extend around a lower region of the pillar 12c. The conductive-gate-body 14c may be referred to as a second conductive-gate-body, and the n-channel-device-active-region 16c may be referred to as a second n-channel-device-active-region.

The pull-up transistor M4 is along the second pillar 12b, and may be referred to as a first pull-up transistor. The pull-up transistor M4 has a conductive-gate-body 14b vertically offset from a p-channel-device-active-region 16b. The active region 16b includes a pair of p-type-doped source/drain regions 17b and 19b, which are spaced from one another by a channel region 21b. In the shown embodiment, the source/drain regions 17b and 19b are configured as annular rings which extend around an upper region of the pillar 12b. The conductive-gate-body 14b may be referred to as a third conductive-gate-body, and the p-channel-device-active-region 16b may be referred to as a first p-channel-device-active-region.

The pull-up transistor M2 is along the fourth pillar 12d, and may be referred to as a second pull-up transistor. The pull-up transistor M2 has a conductive-gate-body 14d vertically offset from a p-channel-device-active-region 16d. The active region 16d includes a pair of p-type-doped source/drain regions 17d and 19d, which are spaced from one another by a channel region 21d. In the shown embodiment, the source/drain regions 17d and 19d are configured as annular rings which extend around a lower region of the pillar 12d. The conductive-gate-body 14d may be referred to as a fourth conductive-gate-body, and the p-channel-device-active-region 16d may be referred to as a second p-channel-device-active-region.

The pull-down transistor M6 is along the fifth pillar 12e, and may be referred to as a third pull-down transistor. The pull-down transistor M6 has a conductive-gate-body 14e vertically offset from an n-channel-device-active-region 16e. The active region 16e includes a pair of n-type-doped source/drain regions 17e and 19e, which are spaced from one another by a channel region 21e. In the shown embodiment, the source/drain regions 17e and 19e are configured as annular rings which extend around an upper region of the pillar 12e. The conductive-gate-body 14e may be referred to as a fifth conductive-gate-body, and the n-channel-device-active-region 16e may be referred to as a third n-channel-device-active-region.

The pull-down transistor M5 is along the sixth pillar 12f, and may be referred to as a fourth pull-down transistor. The pull-down transistor M5 has a conductive-gate-body 14f vertically offset from an n-channel-device-active-region 16f. The active region 16f includes a pair of n-type-doped source/drain regions 17f and 19f, which are spaced from one another by a channel region 21f. In the shown embodiment, the source/drain regions 17f and 19f are configured as annular rings which extend around a lower region of the pillar 12f. The conductive-gate-body 14f may be referred to as a sixth conductive-gate-body, and the n-channel-device-active-region 16f may be referred to as a fourth n-channel-device-active-region.

The conductive-gate-body regions laterally surround the conductive pillars associated with such body regions (e.g., the body region 14*a* laterally surrounds the conductive pillar 12*a*), and the device-active-regions laterally surround the conductive pillars associated with such active regions (e.g., the active region 16*a* laterally surrounds the conductive pillar 12*a*).

Each of the transistors M1-M6 comprises a conductive-gate-body region at one level, and a device-active-region at another level. The device-active-regions 16*c*, 16*d* and 16*f*, and the conductive-gate-body regions 14*a*, 14*b* and 14*e* are at a first level 22; and device-active-regions 16*a*, 16*b* and 16*e*, and the conductive-gate-body regions 14*c*, 14*d* and 14*f* are at a second level 24. In the shown embodiment, the first level 22 is under the second level 24. In other embodiments, the levels may be reversed so that the level 22 is over the level 24 (i.e., the transistors M1-M6 may be inverted relative to the illustrated configuration of FIGS. 2-2B).

The device-active-regions 16*a*-16*f* comprise semiconductor material, and such semiconductor material may comprise any suitable composition(s). In some embodiments, the semiconductor material of the device-active-regions may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some embodiments, the semiconductor material of the device-active-regions may comprise, consist essentially of, or consist of silicon. The silicon may comprise any suitable crystallographic configuration; and in some embodiments may be monocrystalline silicon, polycrystalline silicon, etc. The device-active-regions 16*a*-16*f* may all comprise the same semiconductor material as one another, or not. The source/drain regions 17*a-f* and 19*a-f* are doped regions within the semiconductor material of the device-active-regions 16*a*-16*f*; and the channel regions 21*a-f* are also regions within the semiconductor material of the device-active-regions 16*a*-16*f*.

The integrated assembly 10 includes the interconnect "L" as a first conductive region extending along the first level 22, and includes the interconnect "U" as a second conductive region extending along the second level 24. Specifically, the interconnect "L" includes a first portion 26 corresponding to the conductive-gate-body 14*a*, a second portion 28 corresponding to a conductive ring laterally surrounding the device-active-region 16*c*, a third portion 30 corresponding to the conductive-gate-body 14*b*, a fourth portion 32 corresponding to a conductive ring laterally surrounding the device-active-region 16*d*, and a fifth portion 34 corresponding to a conductive ring laterally surrounding the device-active-region 16*f*. Similarly, the interconnect "U" includes a first portion 36 corresponding a conductive ring laterally surrounding the device-active-region 16*a*, a second portion 38 corresponding to the conductive-gate-body 14*c*, a third portion 40 corresponding to a conductive ring laterally surrounding the device-active-region 16*b*, a fourth portion 42 corresponding to the conductive-gate-body 14*d*, and a fifth portion 44 corresponding to a conductive ring laterally surrounding the device-active-region 16*e*. In some embodiments, the various portions of the first and second interconnects "L" and "U" may be ordered in a different manner than specified above. For instance, the portions 36, 40, 38 and 42 may be referred to as the first through fourth portions, respectively, of the interconnect "U"; and similarly the portions 26, 30, 28 and 32 may be referred to as the first through fourth portions, respectively, of the interconnect "L".

The conductive interconnects "L" and "U" may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, such conductive interconnects may comprise, consist essentially of, or consist of metal-containing materials (e.g., titanium, tungsten, tungsten nitride, titanium nitride, etc.).

In the illustrated embodiment, the first, second, third, fourth, fifth and sixth conductive-gate-bodies (14*a*-14*f*) are spaced from the first, second, third, fourth, fifth and sixth conductive pillars (12*a*-12*f*), respectively, by insulative material 50. Such insulative material may comprise any suitable composition(s); and in some embodiments may comprise, consist essentially, or consist of silicon nitride. Although the same insulative material 50 is described as isolating all of the conductive-gate-bodies from the associated conductive pillars, in other embodiments one or more of the conductive-gate-bodies may be isolated from an associated conductive pillar utilizing a different insulative material than is utilized for isolating another of the conductive-gate-bodies from its associated conductive pillar.

In the shown embodiment, the device-active-regions 16*a*-16*f* directly contact the associated conductive pillars 12*a*-12*f*. In other embodiments, one or more of the device-active-regions may be electrically coupled to an associated conductive pillar through one or more conductive interconnects.

The conductive-gate-bodies 14*e* and 14*f* are not coupled with the interconnects "L" and "U", and instead are laterally surrounded by insulative materials 46 and 48 which isolate such conductive-gate-bodies from the interconnects "L" and "U". The insulative materials 46 and 48 may comprise any suitable composition(s); and in some embodiments may comprise, consist essentially of, or consist of silicon nitride. The insulative materials 46 and 48 may or may not be the same composition as one another. The conductive-gate-bodies 14*e* and 14*f* are coupled with the wordline WL.

In the shown embodiment, the conductive-gate-bodies 14*a*-14*f* are all substantially circular in top-down view (with the term "substantially circular" meaning circular to within reasonable tolerances of fabrication and measurement). In other embodiments, the conductive-gate-bodies may have other shapes. The conductive-gate-bodies 14*a*-14*f* may be considered to correspond to discs.

The device-active-regions 16*a*-16*f*, together with the rings laterally surrounding such regions (i.e., the conductive rings of the conductive interconnect materials "L" and "U", and the insulative rings of the insulative materials 46 and 48) form structures which may also be considered to correspond to discs. The first level 22 comprises a first set of six discs, and the second level 24 comprises a second set of six discs. The first set includes conductive-gate-bodies of the transistors M3, M4 and M6, and includes device-active-regions of the transistors M1, M2 and M5. The second set includes the device-active-regions of the transistors M3, M4 and M6, and includes the conductive-gate-bodies of the transistors M1, M2 and M5.

The discs within the lower level 22 may be considered to be along first segments of the pillars 12*a*-12*f*, and the discs within the upper-level 24 may be considered to be along the second segments of such pillars; with the second segments being vertically offset relative to the first segments. In some embodiments, the discs within the lower level 22 may be each considered to surround a first segment of an associated pillar, and the discs within the upper level 24 may be each considered to surround a second segment of an associated pillar.

In some embodiments, the structures 16a, 16b, 14c, 14d, 16e and 14f may be considered to correspond to first, second, third, fourth, fifth and sixth discs, respectively; and the structures 14a, 14b, 16c, 16d, 14e and 16f may be considered to correspond to seventh, eighth, ninth, tenth, eleventh and twelfth discs, respectively. Discs from the level 22 are paired with discs from the level 24 to form the transistors M1-M6 (e.g., the first and seventh disks are together incorporated into the pull-down transistor M3, the second and eighth disks are together incorporated into the pull-up transistor M4, etc.).

FIGS. 2A and 2B show that the discs within the levels 22 and 24 may have thicknesses T1 and T3, respectively. Such thicknesses may be any suitable thicknesses; and in some embodiments may be within a range of from about 10 nanometers (nm) to about 400 nm. The thicknesses T1 and T3 may be substantially the same as one another, or may be different relative to one another.

FIGS. 2A and 2B also show gate dielectric material 60 configured as a continuous sheet extending through the transistors M1-M6. The gate dielectric material may comprise any suitable composition(s). For instance, in some embodiments the gate dielectric material may comprise one or more insulative oxides (e.g., silicon dioxide, aluminum oxide, hafnium oxide, zirconium oxide, etc.). In some example embodiments, the dielectric material 60 may comprise, consist essentially of, or consist of silicon dioxide.

The dielectric material 60 has a thickness T2. The thickness T2 may be any suitable thickness; and in some embodiments may be within a range of from about 10 angstroms (Å) to about 100 Å.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a first pull-down transistor, a second pull-down transistor, a first pull-up transistor and a second pull-up transistor. The first pull-down transistor has a first conductive-gate-body vertically offset from a first n-channel-device-active-region. The first conductive-gate-body includes a first portion of a first conductive region at a first level. The first n-channel-device-active-region is laterally surrounded by a first portion of a second conductive region. The second conductive region is at a second level vertically offset from the first level. The first pull-up transistor has a second conductive-gate-body vertically offset from a first p-channel-device-active-region. The second conductive-gate-body includes a second portion of the first conductive region. The first p-channel-device-active-region is laterally surrounded by a second portion of the second conductive region. The second pull-down transistor has a third conductive-gate-body vertically offset from a second n-channel-device-active-region. The third conductive-gate-body includes a third portion of the second conductive region. The second n-channel-device-active-region is laterally surrounded by a third portion of the first conductive region. The second pull-up transistor has a fourth conductive-gate-body vertically offset from a second p-channel-device-active-region. The fourth conductive-gate-body includes a fourth portion of the second conductive region. The second p-channel-device-active-region is laterally surrounded by a fourth portion of the first conductive region. A first reference voltage source is coupled with the first and second n-channel-device-active-regions. A second reference voltage source is coupled with the first and second p-channel-device-active-regions.

Some embodiments include an integrated assembly having a first set of disks at a first level, and a second set of disks at a second level which is vertically offset relative to the first level. The first set of disks includes a first disk having a first n-channel-device-active-region surrounding a first segment of a first conductive pillar, and having a first conductive ring surrounding the first n-channel-device-active-region; a second disk having a first p-channel-device-active-region surrounding a first segment of a second conductive pillar, and having a second conductive ring surrounding the first p-channel-device-active-region; a third disk having a first conductive-gate-body surrounding a first segment of a third conductive pillar; a fourth disk having a second conductive-gate-body surrounding a first segment of a fourth conductive pillar; a fifth disk having a third conductive-gate-body surrounding a first segment of a fifth conductive pillar; and a sixth disk having a second n-channel-device-active-region surrounding a first segment of a sixth conductive pillar, and having a third conductive ring surrounding the second n-channel-device-active-region. The second set of disks includes a seventh disk having a fourth conductive-gate-body surrounding a second segment of the first conductive pillar; an eighth disk having a fifth conductive-gate-body surrounding a second segment of the second conductive pillar; a ninth disk having a third n-channel-device-active-region surrounding a second segment of the third conductive pillar, and having a fourth conductive ring surrounding the third n-channel-device-active-region; a tenth disk having a second p-channel-device-active-region surrounding a second segment of the fourth conductive pillar, and having a fifth conductive ring surrounding the second p-channel-device-active-region; an eleventh disk having a fourth n-channel-device-active-region surrounding a second segment of the fifth conductive pillar, and having a sixth conductive ring surrounding the fourth n-channel-device-active-region; and a twelfth disk having a sixth conductive-gate-body surrounding a second region of the sixth conductive pillar.

Some embodiments include an integrated assembly having six conductive pillars laterally adjacent one another. The conductive pillars are a first, second, third, fourth, fifth and sixth conductive pillar. The first and third conductive pillars are coupled to a first reference voltage source. The second and fourth conductive pillars are coupled to a second reference voltage source. The fifth conductive pillar is along a first comparative bitline. The sixth conductive pillar is along a second comparative bitline. A first pull-down transistor is along the first conductive pillar, and has a first conductive-gate-body vertically offset from a first n-channel-device-active-region. The first conductive-gate-body comprises a first portion of a first conductive region at a first level and laterally surrounds the first conductive pillar. The first n-channel-device-active-region laterally surrounds the first conductive pillar, is coupled with the first conductive pillar, and is laterally surrounded by a first portion of a second conductive region. The second conductive region is at a second level vertically offset from the first level. A second pull-down transistor is along the third conductive pillar, and has a second conductive-gate-body vertically offset from a second n-channel-device-active-region. The second conductive-gate-body comprises a second portion of the second conductive region and laterally surrounds the third conductive pillar. The second n-channel-device-active-region laterally surrounds the third conductive pillar, is coupled with the third conductive pillar, and is laterally surrounded by a second portion of the first conductive region. A first pull-up transistor is along the second conductive pillar, and has a third conductive-gate-body vertically offset from a first p-channel-device-active-region. The third conductive-gate-body comprises a third portion of the first conductive region and laterally surrounds the second conductive pillar. The first p-channel-device-active-region laterally surrounds the second conductive pillar, is coupled with the second conductive pillar, and is laterally surrounded by a third portion of the second conductive region. A second pull-up transistor is along the fourth conductive pillar, and has a fourth conductive-gate-body vertically offset from a second p-channel-device-active-region. the fourth conductive-gate-body comprises a fourth portion of the second conductive region and laterally surrounds the fourth conductive pillar. The second p-channel-device-active-region laterally surrounds the fourth conductive pillar, is coupled with the fourth conductive pillar, and is laterally surrounded by a fourth portion of the first conductive region. A third pull-down transistor is along the fifth conductive pillar, and has a fifth conductive-gate-body vertically offset from a third n-channel-device-active-region. The fifth conductive-gate-body laterally surrounds the fifth conductive pillar. The third n-channel-device-active-region laterally surrounds the fifth conductive pillar, is coupled with the fifth conductive pillar, and is laterally surrounded by a fifth portion of the second conductive region. A fourth pull-down transistor is along the sixth conductive pillar, and has a sixth conductive-gate-body vertically offset from a fourth n-channel-device-active-region. The sixth conductive-gate-body laterally surrounds the sixth conductive pillar. The fourth n-channel-device-active-region laterally surrounds the sixth conductive pillar, is coupled with the sixth conductive pillar, and is laterally surrounded by a fifth portion of the first conductive region.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. An integrated assembly, comprising:
   a first pull-down transistor having a first conductive-gate-body vertically offset from a first n-channel-device-active-region; the first conductive-gate-body comprising a first portion of a first conductive region at a first level; the first n-channel-device-active-region being laterally surrounded by a first portion of a second conductive region; the second conductive region being at a second level vertically offset from the first level; and
   a first pull-up transistor having a second conductive-gate-body vertically offset from a first p-channel-device-active-region; the second conductive-gate-body comprising a second portion of the first conductive region; the first p-channel-device-active-region being laterally surrounded by a second portion of the second conductive region.

2. The integrated assembly of claim 1, further comprising:
   a second pull-down transistor having a third conductive-gate-body vertically offset from a second n-channel-device-active-region; and
   a second pull-up transistor having a fourth conductive-gate-body vertically offset from a second p-channel-device-active-region.

3. The integrated assembly of claim 2, further comprising:
   a first reference voltage source coupled with the first and second n-channel-device-active-regions; and
   a second reference voltage source coupled with the first and second p-channel-device-active-regions.

4. The integrated assembly of claim 2 further comprising an insulative sheet extending through the first pull-down transistor, second pull-down transistor, first pull-up transistor and second pull-up transistor.

5. The integrated assembly of claim 4 wherein the insulative sheet comprises silicon dioxide.

6. An integrated assembly, comprising:
a first set of disks at a first level; the first set of disks including:
a first disk having a first n-channel-device-active-region surrounding a first segment of a first conductive pillar, and having a first conductive ring surrounding the first n-channel-device-active-region; and
a second disk having a first p-channel-device-active-region surrounding a first segment of a second conductive pillar, and having a second conductive ring surrounding the first p-channel-device-active-region.

7. The integrated assembly of claim 6 wherein the first set of disks further comprises:
a third disk having a first conductive-gate-body surrounding a first segment of a third conductive pillar;
a fourth disk having a second conductive-gate-body surrounding a first segment of a fourth conductive pillar;
a fifth disk having a third conductive-gate-body surrounding a first segment of a fifth conductive pillar; and
a sixth disk having a second n-channel-device-active-region surrounding a first segment of a sixth conductive pillar, and having a third conductive ring surrounding the second n-channel-device-active-region.

8. The integrated assembly of claim 7, further comprising a second set of disks at a second level; the second level being vertically offset relative to the first level.

9. The integrated assembly of claim 8 wherein the second set of disks includes:
a seventh disk having a fourth conductive-gate-body surrounding a second segment of the first conductive pillar; and
an eighth disk having a fifth conductive-gate-body surrounding a second segment of the second conductive pillar.

10. An integrated assembly, comprising:
six conductive pillars laterally adjacent one another; the conductive pillars being a first, second, third, fourth, fifth and sixth conductive pillar; the first and third conductive pillars being coupled to a first reference voltage source; the second and fourth conductive pillars being coupled to a second reference voltage source; the fifth conductive pillar being along a first comparative bitline; the sixth conductive pillar being along a second comparative bitline; and
a first pull-down transistor along the first conductive pillar, and having a first conductive-gate-body vertically offset from a first n-channel-device-active-region; the first conductive-gate-body comprising a first portion of a first conductive region at a first level and laterally surrounding the first conductive pillar; the first n-channel-device-active-region laterally surrounding the first conductive pillar, being coupled with the first conductive pillar, and being laterally surrounded by a first portion of a second conductive region; the second conductive region being at a second level vertically offset from the first level.

11. The integrated assembly of claim 10, further comprising a second pull-down transistor along the third conductive pillar, and having a second conductive-gate-body vertically offset from a second n-channel-device-active-region; the second conductive-gate-body comprising a second portion of the second conductive region and laterally surrounding the third conductive pillar; the second n-channel-device-active-region laterally surrounding the third conductive pillar, being coupled with the third conductive pillar, and being laterally surrounded by a second portion of the first conductive region.

12. The integrated assembly of claim 11 further comprising a pull-up transistor along the second conductive pillar, and having a third conductive-gate-body vertically offset from a first p-channel-device-active-region; the third conductive-gate-body comprising a third portion of the first conductive region and laterally surrounding the second conductive pillar; the first p-channel-device-active-region laterally surrounding the second conductive pillar, being coupled with the second conductive pillar, and being laterally surrounded by a third portion of the second conductive region.

13. The integrated assembly of claim 12 wherein the pull-up transistor is a first pull-up transistor, and further comprising a second pull-up transistor along the fourth conductive pillar, and having a fourth conductive-gate-body vertically offset from a second p-channel-device-active-region; the fourth conductive-gate-body comprising a fourth portion of the second conductive region and laterally surrounding the fourth conductive pillar; the second p-channel-device-active-region laterally surrounding the fourth conductive pillar, being coupled with the fourth conductive pillar, and being laterally surrounded by a fourth portion of the first conductive region.

14. The integrated assembly of claim 10 wherein the first reference voltage source is at ground, and wherein the second reference voltage source is at Vcc.

15. The integrated assembly of claim 10 wherein the first and second conductive regions comprise metal.

16. The integrated assembly of claim 10 wherein:
the first n-channel-device-active-region directly contacts the first conductive pillar; and
the second n-channel-device-active-region directly contacts the third conductive pillar.

* * * * *